United States Patent
Khan et al.

(10) Patent No.: US 11,444,207 B2
(45) Date of Patent: Sep. 13, 2022

(54) LITHIUM DRIFTED THIN FILM TRANSISTORS FOR NEUROMORPHIC COMPUTING

(71) Applicant: International Business Machines Corporation, Armonk, NY (US)

(72) Inventors: Babar Khan, Ossining, NY (US); Ning Li, White Plains, NY (US); Arvind Kumar, Chappaqua, NY (US); Yun Seog Lee, Seoul (KR); Joel P. de Souza, Putnam Valley, NY (US); Devendra K. Sadana, Pleasantville, NY (US)

(73) Assignee: International Business Machines Corporation, Armonk, NY (US)

(*) Notice: Subject to any disclaimer, the term of this patent is extended or adjusted under 35 U.S.C. 154(b) by 322 days.

(21) Appl. No.: 16/217,651

(22) Filed: Dec. 12, 2018

(65) Prior Publication Data

US 2020/0194597 A1    Jun. 18, 2020

(51) Int. Cl.
| | |
|---|---|
| H01L 29/786 | (2006.01) |
| H01L 29/08 | (2006.01) |
| H01L 29/49 | (2006.01) |
| H01L 29/66 | (2006.01) |
| G06N 3/063 | (2006.01) |

(52) U.S. Cl.
CPC .... *H01L 29/78696* (2013.01); *H01L 29/0847* (2013.01); *H01L 29/4908* (2013.01); *H01L 29/6675* (2013.01); *H01L 29/78672* (2013.01); *G06N 3/063* (2013.01)

(58) Field of Classification Search
CPC ................................................ H01L 29/78648
See application file for complete search history.

(56) References Cited

U.S. PATENT DOCUMENTS

| | | | |
|---|---|---|---|
| 8,589,320 B2 | 11/2013 | Breitwisch et al. | |
| 9,553,056 B1* | 1/2017 | Afzali-Ardakani | ........................ |
| | | | H01L 31/143 |
| 9,852,790 B1* | 12/2017 | Gokmen | ................ G06N 3/084 |

(Continued)

FOREIGN PATENT DOCUMENTS

| | | |
|---|---|---|
| JP | 4482228 B2 | 6/2010 |
| JP | 2012119577 A | 6/2012 |

OTHER PUBLICATIONS

G. Adamopoulos et al., "High-Mobility Low-Voltage ZnO and Li-Doped ZnO Transistors Based on ZrO2 High-k Dielectric Grown by Spray Pyrolysis in Ambient Air," Advanced Materials, Apr. 26, 2011, pp. 1894-1898, vol. 23, No. 16.

(Continued)

*Primary Examiner* — Herve-Louis Y Assouman
*Assistant Examiner* — Christopher A Culbert
(74) *Attorney, Agent, or Firm* — Randall Bluestone; Ryan, Mason & Lewis, LLP (57) ABSTRACT

A semiconductor device includes a field-effect transistor, a first back-end-of-line (BEOL) metallization level and a second BEOL metallization level disposed above the first BEOL metallization level. A portion of the field-effect transistor includes lithium therein, and the field-effect transistor is integrated between the first and second BEOL metallization levels. The portion of the field-effect transistor including the lithium therein can be a channel layer, or a source and/or drain region.

14 Claims, 9 Drawing Sheets

(56) References Cited

U.S. PATENT DOCUMENTS

| | | | |
|---|---|---|---|
| 2001/0045578 A1* | 11/2001 | Hueting | H01L 29/7835 257/216 |
| 2012/0284217 A1 | 11/2012 | Breitwisch et al. | |
| 2013/0049092 A1* | 2/2013 | Liang | H01L 29/78648 257/315 |
| 2015/0221648 A1* | 8/2015 | Gimbert | H01L 21/324 257/351 |
| 2016/0172527 A1* | 6/2016 | Beechem, III | H01L 31/0232 257/294 |
| 2016/0268418 A1 | 9/2016 | Lee et al. | |
| 2016/0350643 A1 | 12/2016 | Hosokawa et al. | |
| 2017/0109626 A1 | 4/2017 | Gokmen et al. | |
| 2017/0194337 A1 | 7/2017 | Lee | |
| 2019/0096886 A1* | 3/2019 | Huang | H01L 27/0921 |

OTHER PUBLICATIONS

C.-H. Tseng et al., "Effects of Excimer Laser Dopant Activation on Low Temperature Polysilicon Thin-Film Transistors with Lightly Doped Drains," Electrochemical and Solid-State Letters, Jul. 12, 2001, pp. G94-G97, vol. 4, No. 11.

M. Xu et al., "A High Performance InGaZnO Thin-Film Transistors Integrated Amplifier Circuit for Capacitance Sensing," IEEE Transactions on Circuits and Systems II: Express Briefs, Jun. 2018, pp. 734-738, vol. 65, No. 6.

T. Gokmen et al., "Acceleration of Deep Neural Network Training with Resistive Cross-Point Devices," Frontiers in Neuroscience, Jul. 21, 2016, 19 pages.

Wenhui Wan et al., "First principles study of lithium insertion in bulk silicon," Journal of Physics Condensed Matter, 2010, 9 pages, vol. 22.

David Cardinal, "Resistive Computing: Based on the Human Brain," PC Magazine Digital Edition, May 2016, 6 pages.

http://en.wikipedia.org/wiki/Neuromophic_engineering, Oct. 18, 2018, 5 pages.

Von K. Steinbuch, Die Lernmatrix, Kybernetik, (1961), pp. 36-45, vol. 1.

* cited by examiner

LITHIUM DRIFTED THIN FILM TRANSISTORS FOR NEUROMORPHIC COMPUTING

TECHNICAL FIELD

The field generally relates to semiconductor devices and methods of manufacturing same and, in particular, to integrating lithium-implanted FETs in the back-end-of-line (BEOL) to be used in place of the resistive elements for resistive processing units (RPUs).

BACKGROUND

In general, neuromorphic computing utilizes very-large-scale integration (VLSI) systems containing analog circuits to mimic neuro-biological architectures present in the nervous system. For example, arrays of trainable resistive devices, referred to as resistive processing units (RPUs), can be used to form artificial neural networks (ANNs), which perform machine learning to learn and implement algorithms.

Conventional RPU architecture includes a plurality of non-volatile resistive elements, such as phase change devices, each in series with a field-effect transistor (FET) connected in a diode configuration, that change their states after application of a certain voltage. For example, conventional RPU devices are implemented with resistive random access memory (RRAM), phase change memory (PCM), programmable metallization cell (PMC) memory, non-linear memristive systems, or any other two-terminal device that has non-linear resistive switching characteristics.

In a standard RPU array, the intersections between a set of row wires and a set of column wires are separated by RPUs, which are resistive elements each having an updateable resistive weight. Input voltages are respectively applied to the row wires, and each column wire sums currents generated by each RPU along a particular column wire. In a forward pass operation, forward matrix multiplication of the array is computed by multiplying values stored in the RPUs by the row wire voltage inputs. In a backward pass operation, backward matrix multiplication of the array is computed by voltages are applied at respective voltages column wires instead of the row wires, reading current from the row wires.

Conventional RPU configurations are noisy and require relatively large amounts of energy for state changes. Accordingly, there is a need for improved configurations which address the issues associated with known RPU configurations.

SUMMARY

According to an exemplary embodiment of the present invention, a semiconductor device includes a field-effect transistor, a first back-end-of-line (BEOL) metallization level and a second BEOL metallization level disposed above the first BEOL metallization level. A portion of the field-effect transistor includes lithium therein, and the field-effect transistor is integrated between the first and second BEOL metallization levels.

According to an exemplary embodiment of the present invention, a method for manufacturing a semiconductor device includes forming a field-effect transistor, and implanting lithium into a portion of the field-effect transistor. In the method, a first back-end-of-line (BEOL) metallization level, and a second BEOL metallization level above the first BEOL metallization level are formed. The field-effect transistor is integrated between the first and second BEOL metallization levels.

According to an exemplary embodiment of the present invention, a semiconductor device includes an array of resistive processing unit (RPU) devices. Each RPU device in the array includes a field-effect transistor integrated between a first back-end-of-line (BEOL) metallization level and a second BEOL metallization level above the first BEOL metallization level. A portion of each field-effect transistor includes lithium therein, and a gate of each field-effect transistor is electrically connected to a contact of the second BEOL metallization level.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

It is to be understood that the various layers and/or regions shown in the accompanying drawings are not drawn to scale, and that one or more layers and/or regions of a type commonly used in, for example, TFT, FET, CMOS, metal-oxide-semiconductor field-effect transistor (MOSFET), single electron transistor (SET), RPU, PCM, PMC, phase-change random-access memory (PCRAM), RRAM, magnetic random-access memory (MRAM) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, TFTs, FETs, CMOSs, MOSFETs, SETs, RPUs, PCMs, PMCs, PCRAMs, RRAMs and/or MRAMs. By way of non-limiting example, the semiconductor devices can include, but are not necessarily limited to TFT, FET, CMOS, MOSFET, SET, RPU, PCM, PMC, PCRAM, RRAM and/or MRAM devices, and/or semiconductor devices that use TFT, FET, CMOS, MOSFET, SET, RPU, PCM, PMC, PCRAM, RRAM and/or MRAM technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to a horizontal top surface of a layer in the cross-sectional views, and "horizontal" refers to a direction parallel to the top surface of the layer in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In accordance with one or more embodiments of the present invention, instead of a conventional resistor based RPU, a lithium-doped FET without a resistor is used in place of the resistive element. The state of the lithium-doped FET changes with an appropriate gate-source voltage ($V_{gs}$) or gate-drain voltage ($V_{gd}$). A device incorporating an array of lithium-doped FETs will have a more linear response and consume much less power than the non-volatile resistive elements currently being used in RPU arrays. Lithium acts as an interstitial donor that compensates p-type doping and can be used to shift the threshold voltage and channel resistance controllably by drifting lithium ions in an applied field.

The introduction of processes required to integrate lithium drifted FETs into existing front-end-of-line (FEOL) processes may face obstacles due to disruption of the FEOL process of record (POR). In addition, the area required by lithium-based FET arrays may use up or occupy a large amount available FEOL space on a chip, and consequently, require increases in the size of the chip.

Embodiments of the present invention utilize lithium-based FET arrays in the BEOL, which will reduce integration obstacles faced in the FEOL. The embodiments of the present invention also reduce the chip area by allowing other elements of the circuit to be built in the FEOL under the lithium-based FET arrays. Lithium drifted TFTs suitable for BEOL processing are described in more detail herein.

In general, BEOL refers to the part of integrated circuit (IC) fabrication where devices (e.g., transistors, capacitors, resistors, etc.) are interconnected with wiring (e.g., metallization levels/layers) on a wafer. BEOL portions of an IC can include, for example, contacts, dielectric layers, metallization levels and bonding sites. BEOL processes are performed after the FEOL processes and are carried out at lower temperatures (typically <400° C.) so that the BEOL processes do not affect the properties of the devices fabricated in the FEOL.

Figure 1:
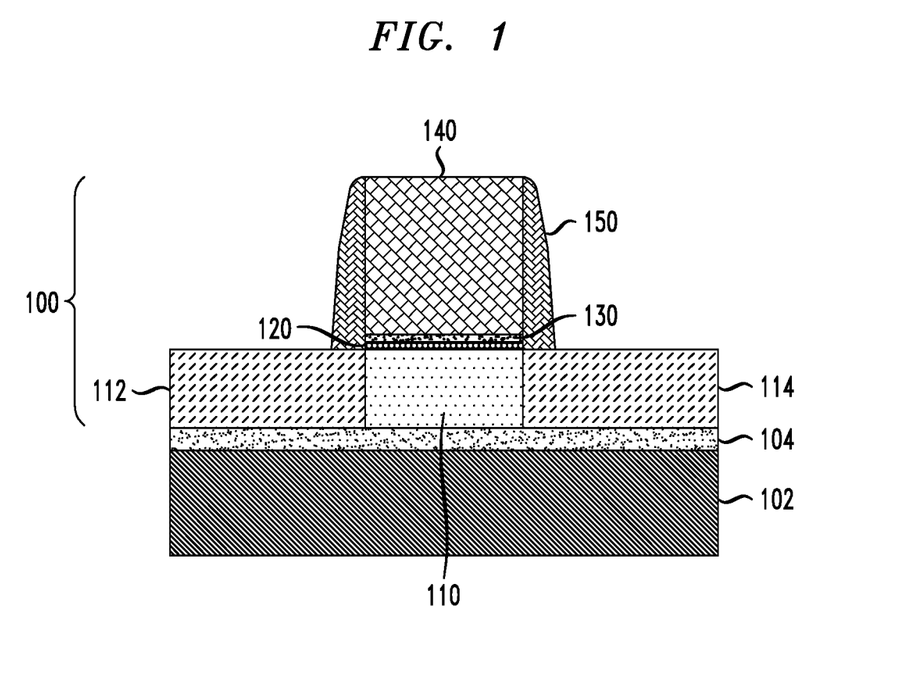
FIG. 1 is a cross-sectional view illustrating a polysilicon gate thin-film transistor (TFT) on a back gate and including a channel region implanted with lithium, according to an exemplary embodiment of the present invention.

FIG. 1 is a cross-sectional view illustrating a polysilicon gate thin-film transistor (TFT) on a back gate and including a channel region implanted with lithium, according to an exemplary embodiment of the present invention. Referring to FIG. 1, a TFT device 100 includes a channel layer 110, which can be formed using, for example, known methods of thin film deposition and patterning. As is known in the art, channels can comprise, for example, polycrystalline silicon or amorphous silicon (a-Si), germanium, poly-germanium or other semiconductor material, and are conducting channels that extend in a direction from a source to a drain.

Use of a thin (e.g., about 10 nm-about 100 nm) polysilicon channel over other materials offers at least the following potential benefits: (1) Lithium drift is faster in polysilicon than in other materials through defect-mediated transport, leading to faster write time; and (2) carrier mobility is much lower in polysilicon than in other materials, leading to higher channel resistance, which is a desired characteristic for RPU functionality.

For example, in a non-limiting illustrative embodiment, in connection with estimating polysilicon thin film RPU resistance, assuming polysilicon hole mobility is ~10 $cm^2$/vs, the on-resistance of a polysilicon TFT will be over 10 times higher for an equivalent x-Si FET. 14 MΩ to 84 MΩ RPU can be achieved by choosing appropriate channel geometry, polysilicon deposition conditions, device structure and operating bias point.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a plasma-enhanced chemical vapor deposition (PECVD) apparatus. A number of different sources may be used for the epitaxial deposition of the in situ doped semiconductor material. In some embodiments, the gas source for the deposition of an epitaxially formed semiconductor material (e.g., an in situ doped semiconductor material) may include silicon (Si) deposited from silane, disilane, trisilane, tetrasilane, hexachlorodi silane, tetrachlorosilane, dichlorosilane, trichlorosilane, and combinations thereof. In other examples, when the epitaxially formed semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C., but epitaxial growth at much lower temperatures has been demonstrated. For the TFT application, perfect epitaxial growth is not a requirement, since the substrate material itself is polycrystalline. Although higher temperature typically results in faster deposition, the faster deposition may result in crystal defects and film cracking. By "in-situ" it is meant that the dopant that dictates the conductivity type of the doped layer is introduced during the process step, e.g., epitaxial deposition, which forms the doped layer.

In accordance with an embodiment of the present invention, lithium is introduced, for example, by a known implantation process, into the channel 110, as shown by layer 120 so that an upper portion of the channel layer 110, including a top surface of the channel layer 110, (also referred to as "channel/gate dielectric interface") includes lithium therein. Lithium ions are implanted at the channel/gate dielectric interface 120. The implant energy can be adjusted to place the lithium atoms anywhere within the channel layer 110 or at the channel/dielectric interface 120. The preference is to place the lithium atoms at or near the interface 120 where the operating electric fields are the highest. The motion of the lithium ions inside the gate dielectric layer 130 and at the channel/gate dielectric interface 120 has a significant impact on threshold voltage.

As can be seen in subsequently described embodiments, the lithium can alternatively be introduced in source and/or drain regions. Depending on where the lithium is implanted, different biasing schemes can be employed to modulate the lithium concentration. Lithium concentration in the channel can vary from 1e16/$cm^3$ to 5e19/$cm^3$. An alternative to polysilicon as a material for the channel 110 is poly-germanium (poly-Ge). Lithium drifts more easily in germanium than in silicon. Therefore, embodiments of the invention are also applicable to poly-Ge TFTs. If the source-drain regions are SiGe, then lithium may have a preference for that region, unless driven from the source-drain regions with an electric field during a write operation. Germanium may be used to control lithium drift.

The gate dielectric layer 130 is formed on channel/gate dielectric interface 120. In accordance with an embodiment of the present invention, the gate dielectric 130 includes, for example, silicon oxide ($SiO_x$) (x is, for example, 1.99, 2, 2.01), or other appropriate gate dielectric, such as $HfO_x$ or $HFSiO_x$.

A gate 140 is formed on the gate dielectric layer 130 and comprises, for example, polysilicon. The gate 140 can be deposited using a deposition technique including, but not necessarily limited to, chemical vapor deposition (CVD), PECVD, radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating.

Spacers 150 are formed adjacent to the gate 140, to be in direct contact with opposing sidewalls of the gate 140. The spacers 150 can include a dielectric insulating material such as, for example, $SiO_x$, carbon doped silicon oxide (SiOC), silicon nitride (SiN), silicon oxynitride (SiON), carbon doped silicon oxynitride (SiOCN), boron nitride (BN), silicon boron nitride (SiBN), silicon boron carbon nitride (SiBCN) or multilayered stacks thereof. Source and drain regions 112 and 114, respectively, are formed adjacent to the spacers 150 and the channel layer 110 by low temperature epitaxial growth with in-situ doping or by dopant implantation. The source and drain regions 112 and 114 may comprise semiconductor material including, but not limited to, Si, SiGe, SiC, SiGeC or other like semiconductor with dopants, such as, boron, phosphorus, arsenic and any other applicable elements.

The TFT device 100 is fabricated in the BEOL using low temperature (e.g., <400° C.) processes. The TFT is optionally formed on and/or electronically connected to a back gate 102 comprising, for example, a conductive metal, such as, for example, copper, tungsten (W), titanium (Ti), ruthenium (Ru), cobalt (Co), titanium nitride (TiN), or combinations thereof, which is connected to a metallization layer. A thin dielectric layer 104 comprising, for example, silicon nitride (SiN), silicon carbon nitride (SiCN), $HFO_x$, $HFSiO_x$ or silicon nitrided oxide (SiNO) is formed on the back gate 102. A thickness of the dielectric layer 104 is in the range of about 10 angstroms to about 100 angstroms.

The TFT device 100 and the back gate and dielectric 102 and 104, which are formed at the BEOL, may be formed on a semiconductor substrate (not shown), with intervening layers (e.g., lower conductive lines, transistors, capacitors, resistors, other devices, etc.) between the back gate 102 or TFT device 100 and the substrate. A semiconductor substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors.

Figure 2:
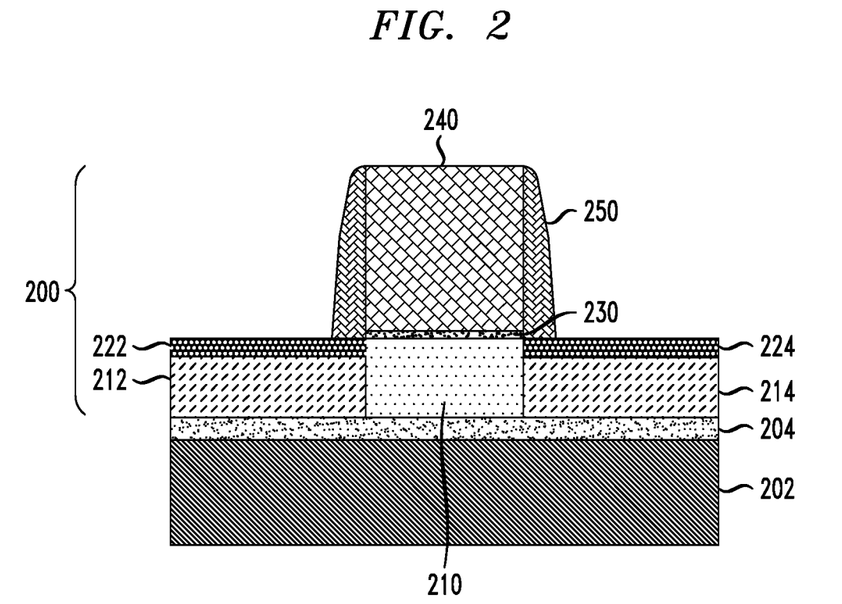
FIG. 2 is a cross-sectional view illustrating a polysilicon gate TFT on a back gate and including source and drain regions implanted with lithium, according to an exemplary embodiment of the present invention.

FIG. 2 is a cross-sectional view illustrating a polysilicon gate TFT on a back gate and including source and drain regions implanted with lithium, according to an exemplary embodiment of the present invention. Referring to FIG. 2, a TFT device 200 includes a channel layer 210 similar to the channel layer 110 described in connection with FIG. 1. Unlike the channel layer 110, the channel layer 210 is not implanted with lithium. Unless otherwise indicated, elements in FIG. 2 with similar reference numbers to those in FIG. 1 have the same or similar structure as those elements in FIG. 1, and for the sake of brevity, duplicative descriptions of those elements are omitted.

A gate dielectric layer 230 including the same or similar material and structure as the gate dielectric layer 130 is formed on channel 210. A gate 240 including the same or similar material and structure as the gate 140 is formed on the gate dielectric layer 230.

Spacers 250 including the same or similar material and structure as the spacers 150 are formed adjacent to the gate 240, to be in direct contact with opposing sidewalls of the gate 240.

Source and drain regions 212 and 214, respectively, are formed adjacent to the spacers 250 and the channel layer 210 by low temperature epitaxial growth with in-situ doping or by dopant implantation. The source and drain regions 212 and 214 may comprise semiconductor material including, but not limited to, Si, SiGe, SiC, SiGeC or other like semiconductor with dopants, such as, boron, phosphorus, arsenic and any other applicable elements.

In accordance with an embodiment of the present invention, lithium is introduced, for example, by a known implantation process, in the source and drain regions 212 and 214, respectively, as shown by layers 222 and 224 so that upper portions of the source and drain regions 212 and 214, including top surfaces of the source and drain regions 212 and 214, include lithium therein. The source and drain regions 212 and 214 are generally very heavily doped, so the lithium concentration in these regions can be in the range of about $1e16/cm^3$-about $1e19/cm^3$ without impacting the source-drain doping levels. According to an embodiment, the lithium implant is done at a slight angle to position the lithium closer to the junction edges of the source and drain regions. The depth of the lithium implant will be less than the depth of the source and drain regions 212 and 214 (e.g., about 10 nm-about 100 nm), and adjacent to the channel.

Like the TFT device 100, the TFT device 200 is fabricated in the BEOL using low temperature (e.g., <400° C.) processes, and is optionally formed on and/or electronically connected to a back gate 202 comprising a thin dielectric layer 204 formed thereon. The back gate and thin dielectric layer 202 and 204 include the same or similar material and structure as the back gate and thin dielectric layer 102 and 104. The TFT device 200 and the back gate and dielectric 202 and 204, which are formed at the BEOL, may be formed on a semiconductor substrate.

Figure 3:
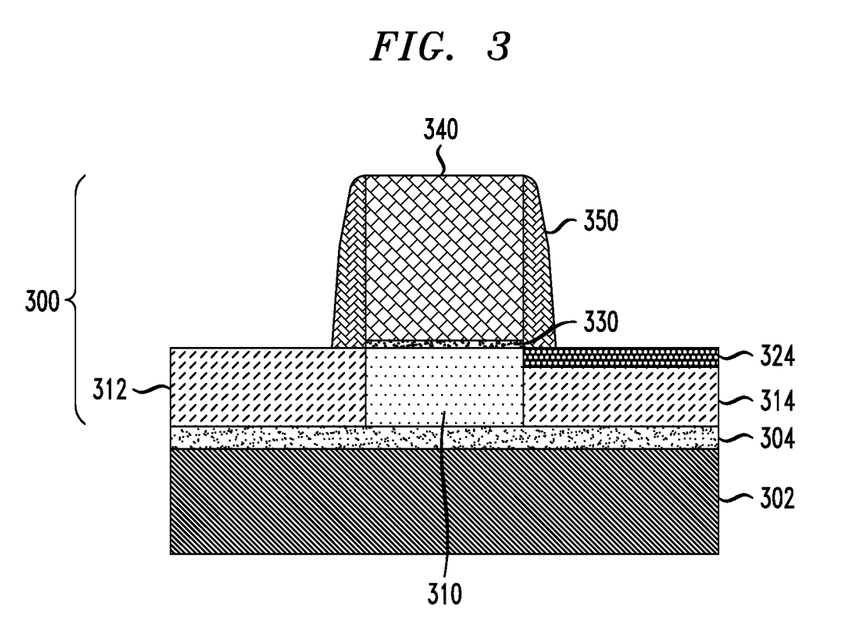
FIG. 3 is a cross-sectional view illustrating a polysilicon gate TFT on a back gate and including a drain region implanted with lithium, according to an exemplary embodiment of the present invention.

FIG. 3 is a cross-sectional view illustrating a polysilicon gate TFT on a back gate and including a drain region implanted with lithium, according to an exemplary embodiment of the present invention. Referring to FIG. 3, a TFT device 300 includes a channel layer 310 similar to the channel layer 210 described in connection with FIG. 2. Unless otherwise indicated, elements in FIG. 3 with similar reference numbers to those in FIG. 1 or 2 have the same or similar structure as those elements in FIG. 1 or 2, and for the sake of brevity, duplicative descriptions of those elements are omitted. Unlike the channel layer 110, the channel layer 310 is not implanted with lithium.

A gate dielectric layer 330 including the same or similar material and structure as the gate dielectric layer 130 or 230 is formed on channel 310. A gate 340 including the same or similar material and structure as the gate 140 or 240 is formed on the gate dielectric layer 330.

Spacers 350 including the same or similar material and structure as the spacers 150 or 250 are formed adjacent to the gate 340, to be in direct contact with opposing sidewalls of the gate 340.

Source and drain regions 312 and 314, respectively, are formed adjacent to the spacers 350 and the channel layer 310 by low temperature epitaxial growth with in-situ doping or by dopant implantation. The source and drain regions 312 and 314 may comprise semiconductor material including, but not limited to, Si, SiGe, SiC, SiGeC or other like semiconductor with dopants, such as, boron, phosphorus, arsenic and any other applicable elements.

In accordance with an embodiment of the present invention, lithium is introduced, for example, by a known implantation process, in the drain region 314, as shown by layer 324 so that an upper portion of the drain region 314, including a top surface of the drain region 314, includes lithium therein. The source and drain regions 312 and 314 are generally very heavily doped, so the lithium concentration in the drain region 314 can be in the range of about $1e16/cm^3$-about $1e19/cm^3$ without impacting the drain doping level. According to an embodiment, the lithium implant is done at a slight angle to position the lithium closer to the junction edge of the drain region 314, adjacent to the channel. The depth of the lithium implant will be approximately the depth of the drain region 314 (e.g., about 10 nm-about 100 nm). Unlike the source region 212, the source region 312 is not implanted with lithium.

Like the TFT devices 100 and 200, the TFT device 300 is fabricated in the BEOL using low temperature (e.g., <400° C.) processes, and is optionally formed on and/or electronically connected to a back gate 302 comprising a thin dielectric layer 304 formed thereon. The back gate and thin dielectric layer 302 and 304 include the same or similar material and structure as the back gate and thin dielectric layer 102 and 104 or 202 and 204. The TFT device 300 and the back gate and dielectric 302 and 304, which are formed at the BEOL, may be formed on a semiconductor substrate.

Figure 4A:
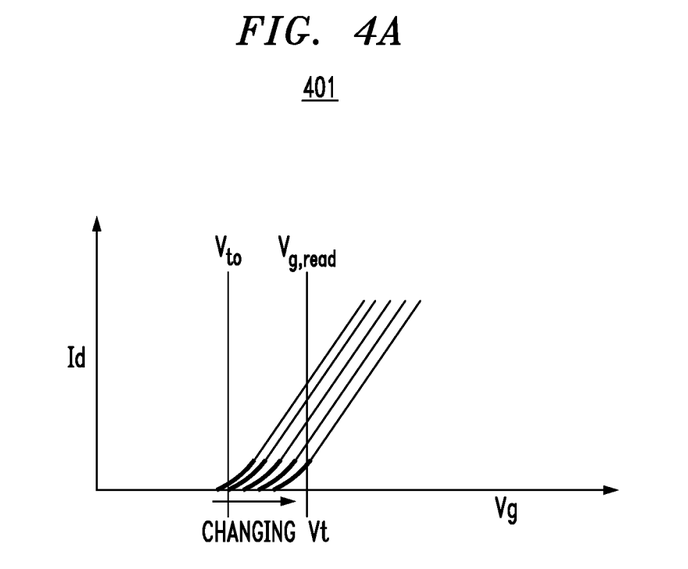
FIG. 4A is a graph illustrating threshold voltage change due to lithium drift, according to an exemplary embodiment of the present invention.
Figure 4B:
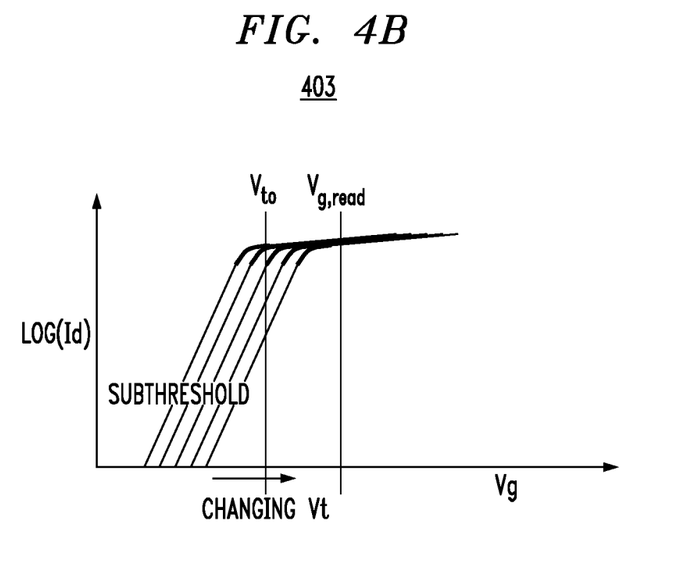
FIG. 4B is a graph illustrating threshold voltage change due to lithium drift, according to an exemplary embodiment of the present invention.

FIGS. 4A and 4B are graphs of drain current (Id) and log of the drain current log(Id), respectively, versus gate voltage (Vg). The graphs 401 and 403 illustrate threshold voltage change due to lithium drift, according to an exemplary embodiment of the present invention. Referring to FIGS. 4A-4B, due to lithium drift in an applied field, the threshold voltage may gradually increase. For example, forward and backward passes are read operations and are preferably performed with as low voltages as possible to avoid unintentional drift of lithium. The source-drain can be biased in the linear regime (typically <100 mV), and the gate ($V_{g,read}$) can be biased somewhat above the unshifted threshold voltage ($V_{to}$), to allow for minimum disturbance and high channel resistance.

Weight updates are done using stochastic bit streams, which can be applied to the gate-source, gate-substrate (if available) or source-drain. Gate-substrate may be the preferred method, since it effectively decouples the read and write operations (i.e., gate-substrate moves lithium orthogonal to direction of source-drain bias). Up-down conductance response is expected to be symmetric since lithium drift can be reversed by applying opposite polarity. Source-drain bias disturbance can be minimized by using low drain to Vds (source-drain bias) and by using symmetric AC bias.

As noted above, lithium can be introduced in the source and/or drain, or in the channel. Depending on where the lithium is, different biasing schemes can be employed to modulate the lithium concentration.

Figure 5:
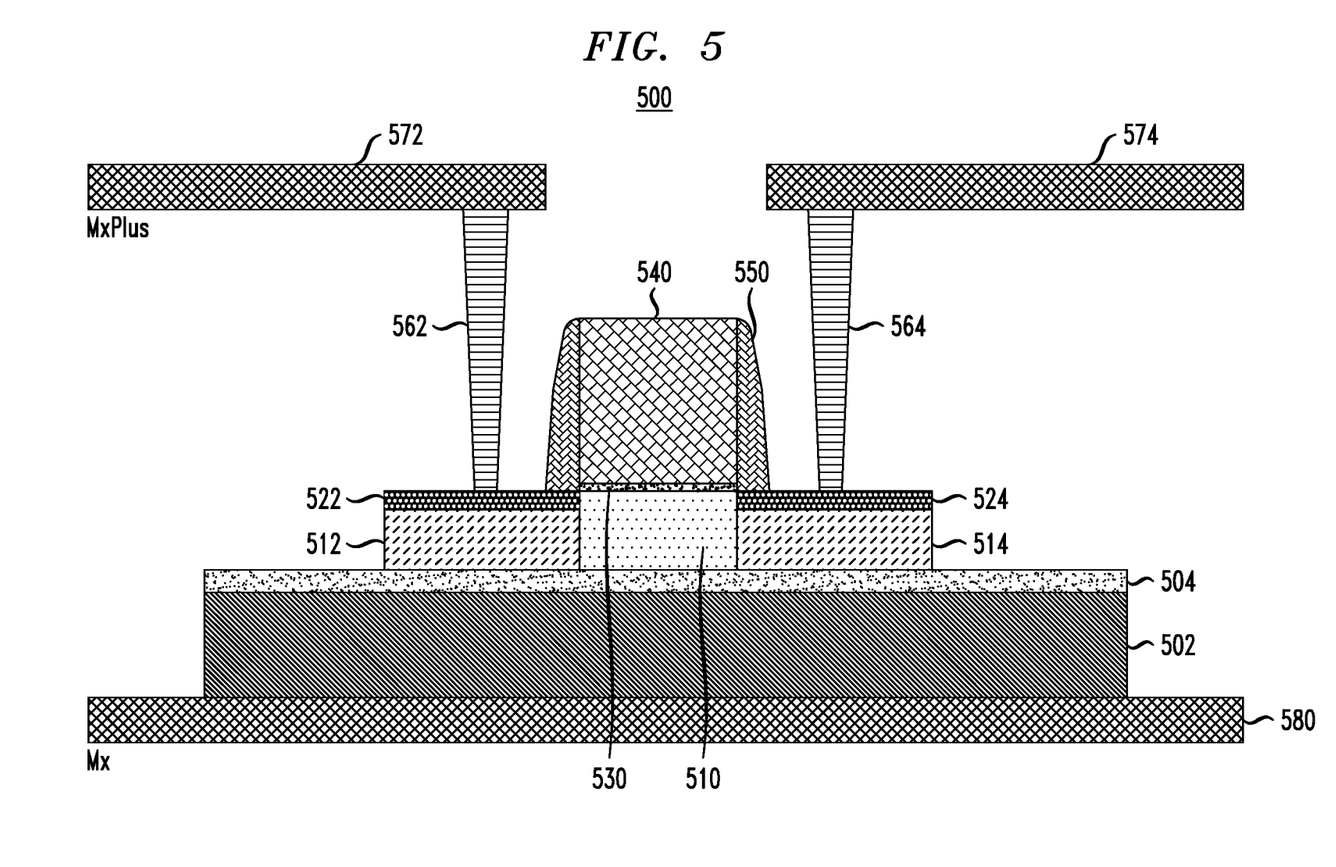
FIG. 5 is a cross-sectional view illustrating a polysilicon gate TFT including source and drain regions implanted with lithium and connected between back-end-of-line (BEOL) metallization levels, according to an exemplary embodiment of the present invention.
Figure 6:
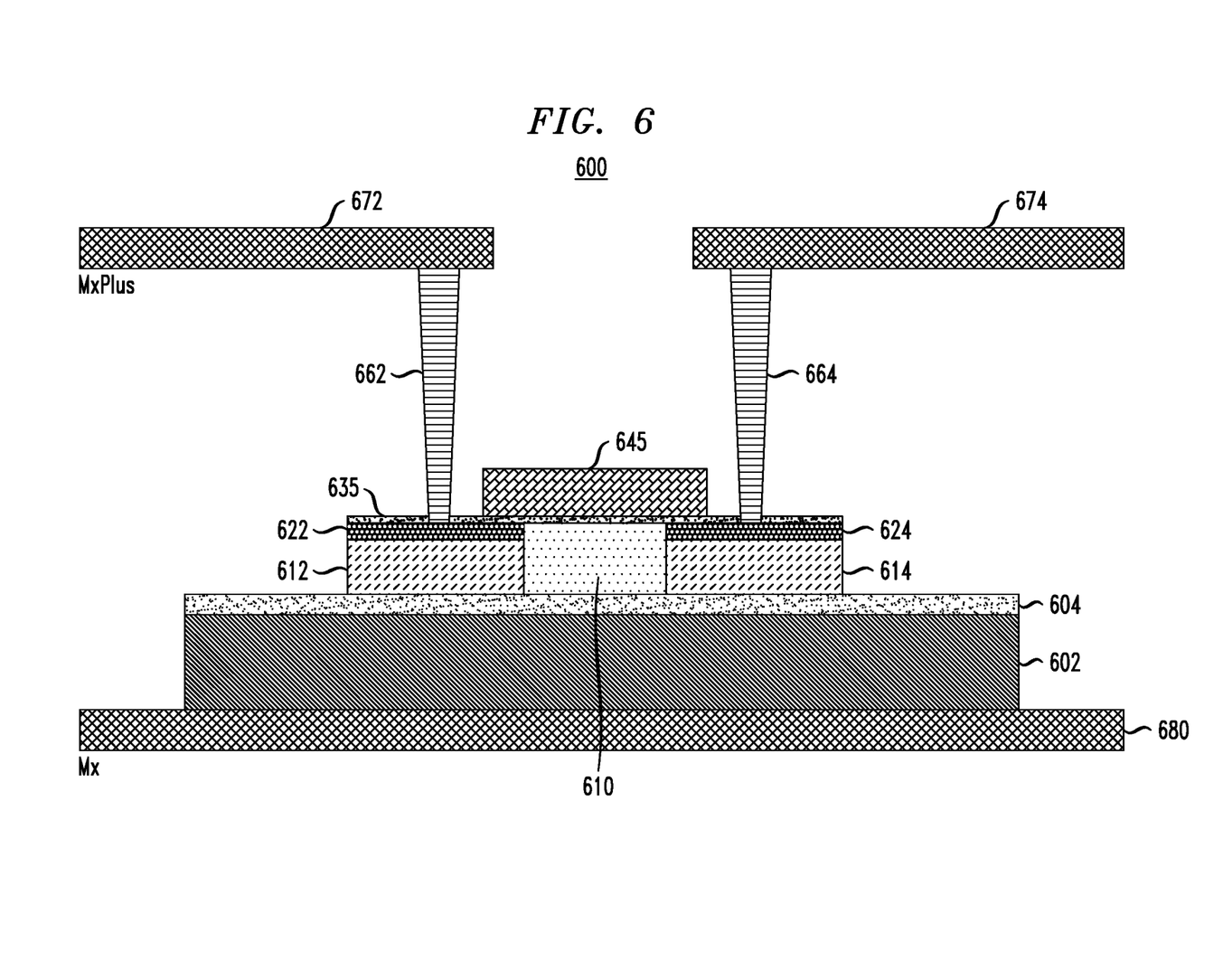
FIG. 6 is a cross-sectional view illustrating a metal gate TFT including source and drain regions implanted with lithium and connected between BEOL metallization levels, according to an exemplary embodiment of the present invention.
Figure 7:
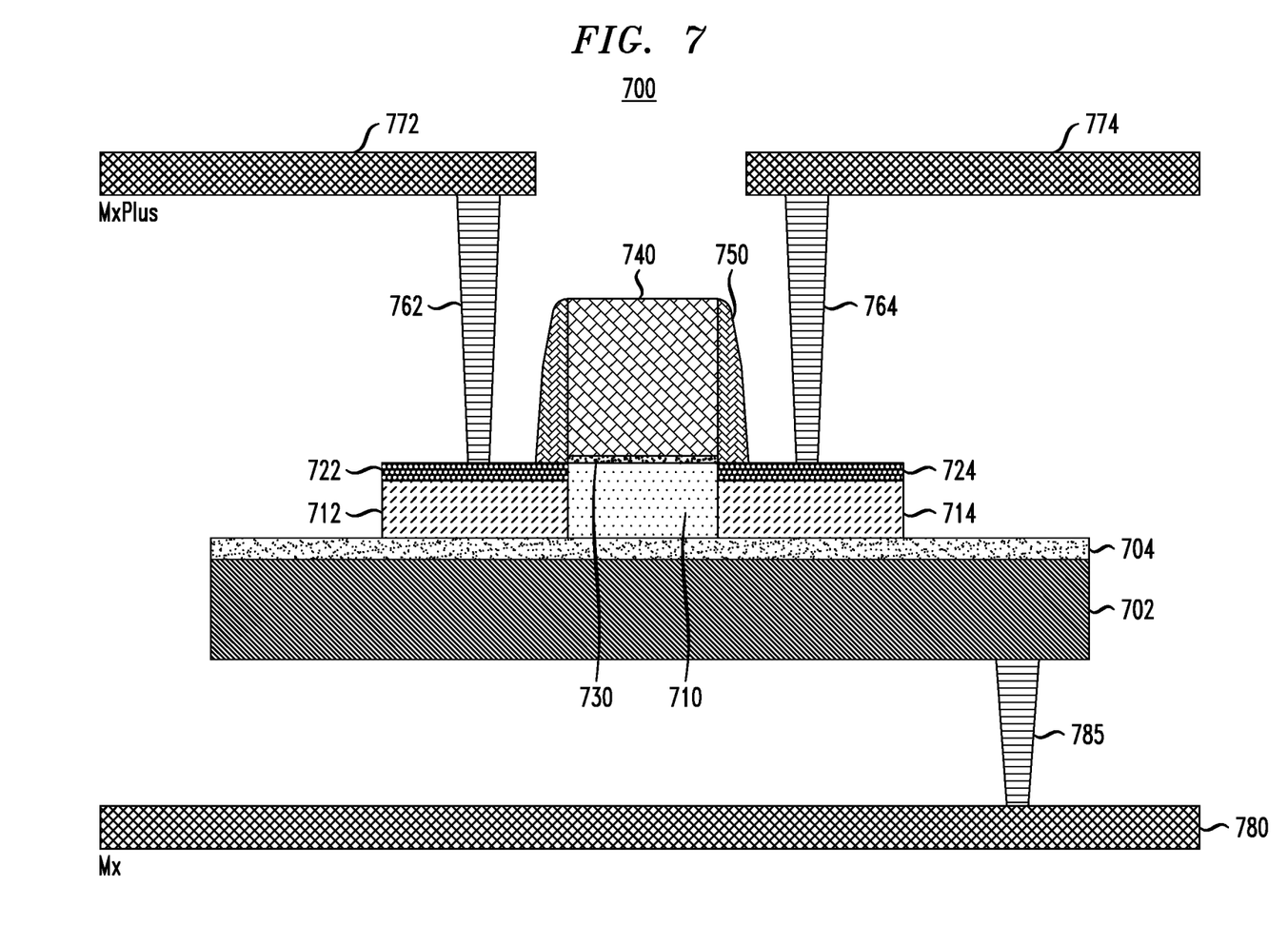
FIG. 7 is a cross-sectional view illustrating a polysilicon gate TFT including source and drain regions implanted with lithium and connected between BEOL metallization levels, according to an exemplary embodiment of the present invention.
Figure 8:
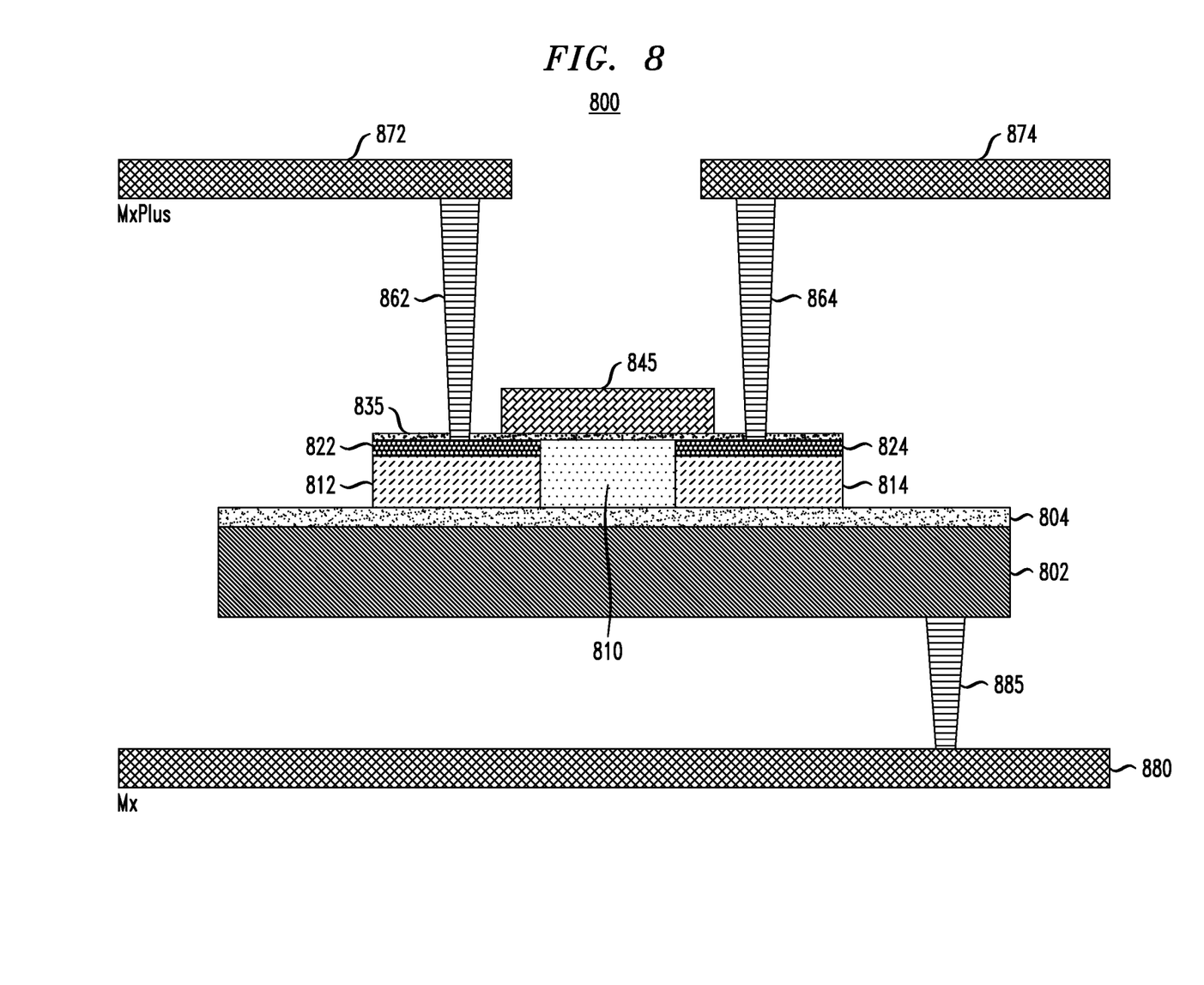
FIG. 8 is a cross-sectional view illustrating a metal gate TFT including source and drain regions implanted with lithium and connected between BEOL metallization levels, according to an exemplary embodiment of the present invention.

As shown in FIGS. 5-10, TFTs having lithium implanted portions can be integrated into the BEOL. As shown in FIGS. 5-8, the lithium based TFTs can be integrated into the BEOL between two metal interconnect layers Mx and MxPlus in multiple ways. FIGS. 5 and 7 show two embodiments for polysilicon gate FETs and FIGS. 6 and 8 show two embodiments for metal gate TFTs. The devices can be integrated by building a metal pedestal as the back gate of the TFT and then building the TFT on top of the metal pedestal.

FIG. 5 is a cross-sectional view illustrating a polysilicon gate TFT including source and drain regions implanted with lithium and connected between BEOL metallization levels, according to an exemplary embodiment of the present invention. Referring to FIG. 5, a device 500 includes a TFT similar to the TFT 200 shown in FIG. 2. The TFT in FIG. 5 includes channel layer 510 similar to the channel layer 210 described in connection with FIG. 2. Unless otherwise indicated, elements in FIG. 5 with similar reference numbers to those in FIG. 2 have the same or similar structure as those elements in FIG. 2, and for the sake of brevity, duplicative descriptions of those elements are omitted.

A gate dielectric layer 530 including the same or similar material and structure as the gate dielectric layer 230 is formed on channel 510. A gate 540 including the same or similar material and structure as the gate 240 is formed on the gate dielectric layer 530. Spacers 550 including the same or similar material and structure as the spacers 250 are formed adjacent to the gate 540, to be in direct contact with opposing sidewalls of the gate 540.

Source and drain regions 512 and 514, respectively, are formed adjacent to the spacers 550 and the channel layer 510 by low temperature epitaxial growth with in-situ doping or by dopant implantation. The source and drain regions 512 and 514 may comprise semiconductor material including, but not limited to, Si, SiGe, SiC, SiGeC or other like semiconductor with dopants, such as, boron, phosphorus, arsenic and any other applicable elements. In accordance with an embodiment of the present invention, lithium is introduced, for example, by a known implantation process, in the source and drain regions 512 and 514, respectively, as shown by layers 522 and 524.

The TFT device in FIG. 5 is formed on and/or electronically connected to a back gate 502 comprising a thin dielectric layer 504 formed thereon. The back gate and thin dielectric layer 502 and 504 include the same or similar material and structure as the back gate and thin dielectric layer 202 and 204.

Contacts to the source 512, drain 514 and gate 540 (gate contact is not shown in the figures), are made using, for example, vias 562 and 564 that connect to metal contacts 572, 574 in an upper metal interconnect layer MxPlus of the BEOL. The back gate 502 in FIG. 5 is formed on and electrically connected to a metal contact 580 of a lower metal interconnect layer Mx of the BEOL. For example, the 2 metal interconnect layers (Mx and MxPlus) can be consecutive metal layers of the BEOL (example M2 and M3) or 2 metal interconnect layers that are separated by one or more metal interconnect layers (example M2 and M4), if more height is needed to accommodate the TFT. Accordingly, for Mx, x can be an integer greater than or equal to 0, while for MxPlus, xPlus is an integer greater than the value of x.

The vias 562 and 564 contact the layers 522 and 524 on the source and drain regions 512 and 522. The vias 562 and 564 each comprise, for example, a conductive metal formed in a trench through a dielectric layer (not shown). The metal contacts 572, 574 and 580 also comprise a conductive metal. The conductive metal of the vias 562 and 564 and of metal contacts 572, 574 and 580 can include, but is not necessarily limited to, W, Ti, Ru, Co, TiN or other conductive metal or alloys thereof.

FIG. 6 is a cross-sectional view illustrating a metal gate TFT including source and drain regions implanted with lithium and connected between BEOL metallization levels, according to an exemplary embodiment of the present invention. Referring to FIG. 6, a device 600 includes a TFT similar to the TFT 500 shown in FIG. 5, with some exceptions. For example, the TFT in FIG. 6 is a metal gate TFT, not a polysilicon gate TFT. For example, the metal gate 645 includes a conductive metal, including, but not necessarily limited to, W, Ti, Ru, Co, TiN or other conductive metal or alloys thereof.

The TFT in FIG. 6 includes channel layer 610 similar to the channel layer 510 described in connection with FIG. 5. Unless otherwise indicated, elements in FIG. 6 with similar reference numbers to those in FIG. 5 have the same or similar structure as those elements in FIG. 5, and for the sake of brevity, duplicative descriptions of those elements are omitted.

A gate dielectric layer 635 is formed on the channel 610 and on source and drain regions 612 and 614 including the lithium implanted layers 622 and 624 thereon. In accordance with an embodiment of the present invention, the gate dielectric 635 includes, for example, $SiO_x$ or other appropriate gate dielectric The metal gate 645 is formed on a portion of the gate dielectric layer 635 over the channel 610 and over portions of the lithium implanted layers 622 and 624 adjacent the channel 610. Unlike the polysilicon gate TFTs, there are no spacers around the metal gate 645.

The source and drain regions 612 and 614, respectively, are formed adjacent to the channel layer 610 by low temperature epitaxial growth with in-situ doping or by dopant implantation. The source and drain regions 612 and 614 may comprise semiconductor material including, but not limited to, Si, SiGe, SiC, SiGeC or other like semiconductor with dopants, such as, boron, phosphorus, arsenic and any other applicable elements. In accordance with an embodiment of the present invention, lithium is introduced, for example, by a known implantation process, in the source and drain regions 612 and 614, respectively, as shown by layers 622 and 624.

The TFT device in FIG. 6 is formed on and/or electronically connected to a back gate 602 comprising a thin dielectric layer 604 formed thereon. The back gate and thin dielectric layer 602 and 604 include the same or similar material and structure as the back gate and thin dielectric layer 502 and 504.

Contacts to the source 612, drain 614 and gate 645 (gate contact is not shown in the figures), are made using, for example, vias 662 and 664 that connect to metal contacts 672, 674 in an upper metal interconnect layer MxPlus of the BEOL. The back gate 602 in FIG. 6 is formed on and electrically connected to a metal contact 680 of a lower metal interconnect layer Mx of the BEOL.

The vias 662 and 664 are formed through the gate dielectric layer 635 to contact the layers 622 and 624 on the source and drain regions 612 and 622. The vias 662 and 664 each comprise, for example, a conductive metal formed in a trench through a dielectric layer (not shown). The metal contacts 672, 674 and 680 also comprise a conductive metal. The conductive metal of the vias 662 and 664 and of metal contacts 672, 674 and 580 can include, but is not necessarily limited to, W, Ti, Ru, Co, TiN or other conductive metal or alloys thereof.

FIG. 7 is a cross-sectional view illustrating a polysilicon gate TFT including source and drain regions implanted with lithium and connected between BEOL metallization levels, according to an exemplary embodiment of the present invention. Referring to FIG. 7, a device 700 includes a TFT similar to the TFT 200 shown in FIG. 2. The TFT in FIG. 7 includes channel layer 710 similar to the channel layer 210 described in connection with FIG. 2. Unless otherwise indicated, elements in FIG. 7 with similar reference numbers to those in FIG. 2 have the same or similar structure as those elements in FIG. 2, and for the sake of brevity, duplicative descriptions of those elements are omitted.

A gate dielectric layer 730 including the same or similar material and structure as the gate dielectric layer 230 is formed on channel 710. A gate 740 including the same or similar material and structure as the gate 240 is formed on the gate dielectric layer 730. Spacers 750 including the same or similar material and structure as the spacers 250 are formed adjacent to the gate 740, to be in direct contact with opposing sidewalls of the gate 740.

Source and drain regions 712 and 714, respectively, are formed adjacent to the spacers 750 and the channel layer 710 by low temperature epitaxial growth with in-situ doping or by dopant implantation. The source and drain regions 712 and 714 may comprise semiconductor material including, but not limited to, Si, SiGe, SiC, SiGeC or other like semiconductor with dopants, such as, boron, phosphorus, arsenic and any other applicable elements. In accordance with an embodiment of the present invention, lithium is introduced, for example, by a known implantation process, in the source and drain regions 712 and 714, respectively, as shown by layers 722 and 724.

The TFT device in FIG. 7 is formed on and/or electronically connected to a back gate 702 comprising a thin dielectric layer 704 formed thereon. The back gate and thin dielectric layer 702 and 704 include the same or similar material and structure as the back gate and thin dielectric layer 202 and 204.

Contacts to the source 712, drain 714 and gate 740 (gate contact is not shown in the figures), are made using, for example, vias 762 and 764 that connect to metal contacts 772, 774 in an upper metal interconnect layer MxPlus of the BEOL. The vias 762 and 764 contact the layers 722 and 724 on the source and drain regions 712 and 722. The back gate 702 in FIG. 7 is electrically connected to a metal contact 780 of a lower metal interconnect layer Mx of the BEOL by a via 785. Unlike the structure in FIG. 5, the back gate 702 is spaced apart from and connected to the lower metal interconnect layer with the via 785 so that there may be easier integration and less impact on the POR BEOL process than the embodiment in FIG. 5.

The vias 762, 764 and 785 each comprise, for example, a conductive metal formed in a trench through a dielectric layer (not shown). The metal contacts 772, 774 and 780 also comprise a conductive metal. The conductive metal of the vias 762, 764 and 785 and of metal contacts 772, 774 and 780 can include, but is not necessarily limited to, W, Ti, Ru, Co, TiN or other conductive metal or alloys thereof.

FIG. 8 is a cross-sectional view illustrating a metal gate TFT including source and drain regions implanted with lithium and connected between BEOL metallization levels, according to an exemplary embodiment of the present invention. Referring to FIG. 8, a device 800 includes a TFT similar to the TFT 600 shown in FIG. 6. Like the TFT in FIG. 6, the TFT in FIG. 8 is a metal gate TFT. For example, the metal gate 845 includes a conductive metal, including, but not necessarily limited to, W, Ti, Ru, Co, TiN or other conductive metal or alloys thereof.

The TFT in FIG. 8 includes channel layer 810 similar to the channel layer 610 described in connection with FIG. 6. Unless otherwise indicated, elements in FIG. 8 with similar reference numbers to those in FIG. 6 have the same or similar structure as those elements in FIG. 6, and for the sake of brevity, duplicative descriptions of those elements are omitted.

A gate dielectric layer 835 is formed on the channel 810 and on source and drain regions 812 and 814 including the lithium implanted layers 822 and 824 thereon. The metal gate 845 is formed on a portion of the gate dielectric layer 835 over the channel 810 and over portions of the lithium implanted layers 822 and 824 adjacent the channel 810.

The TFT device in FIG. 8 is formed on and/or electronically connected to a back gate 802 comprising a thin dielectric layer 804 formed thereon. The back gate and thin dielectric layer 802 and 804 include the same or similar material and structure as the back gate and thin dielectric layer 602 and 604.

Contacts to the source 812, drain 814 and gate 845 (gate contact is not shown in the figures), are made using, for example, vias 862 and 864 that connect to metal contacts 872, 874 in an upper metal interconnect layer MxPlus of the BEOL. The back gate 802 in FIG. 8 is electrically connected to a metal contact 880 of a lower metal interconnect layer Mx of the BEOL by a via 885. Unlike the structure in FIG. 6, the back gate 802 is spaced apart from and connected to the lower metal interconnect layer with the via 885 so that there may be easier integration and less impact on the POR BEOL process than the embodiment in FIG. 6.

The vias 862 and 864 are formed through the gate dielectric layer 835 to contact the layers 822 and 824 on the source and drain regions 812 and 814. The vias 862, 864 and 885 each comprise, for example, a conductive metal formed in a trench through a dielectric layer (not shown). The metal contacts 872, 874 and 880 also comprise a conductive metal. The conductive metal of the vias 862, 864 and 885 and of metal contacts 872, 874 and 880 can include, but is not necessarily limited to, W, Ti, Ru, Co, TiN or other conductive metal or alloys thereof.

Figure 9:
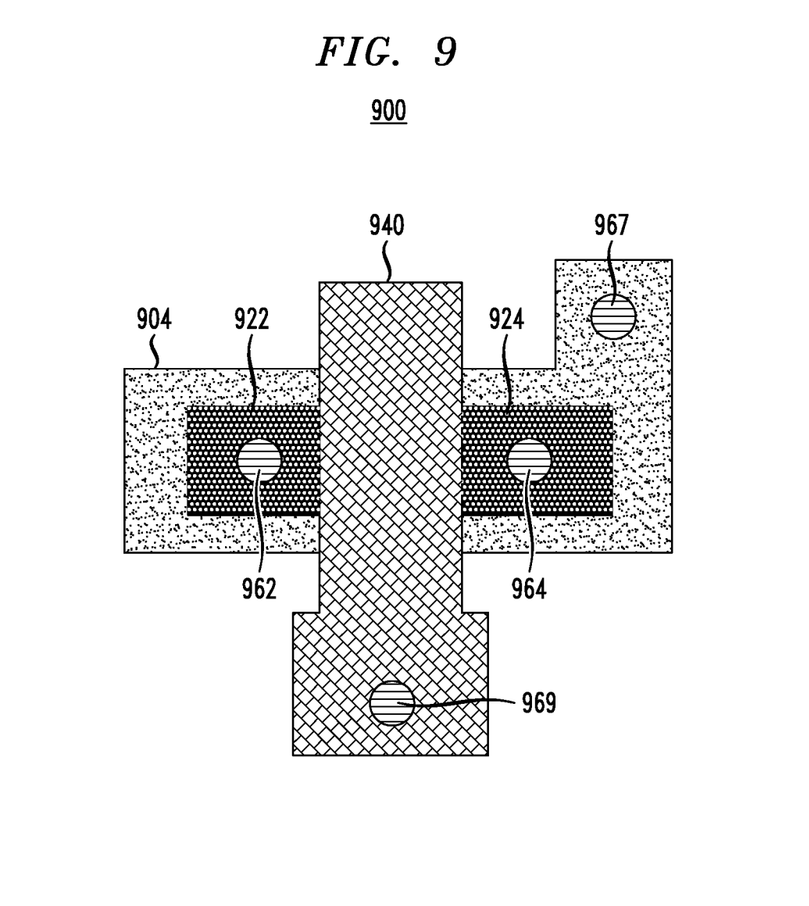
FIG. 9 is a top layout view illustrating a polysilicon TFT on a back gate without a body contact connected to a channel region and including source and drain regions implanted with lithium, according to an exemplary embodiment of the present invention.
Figure 10:
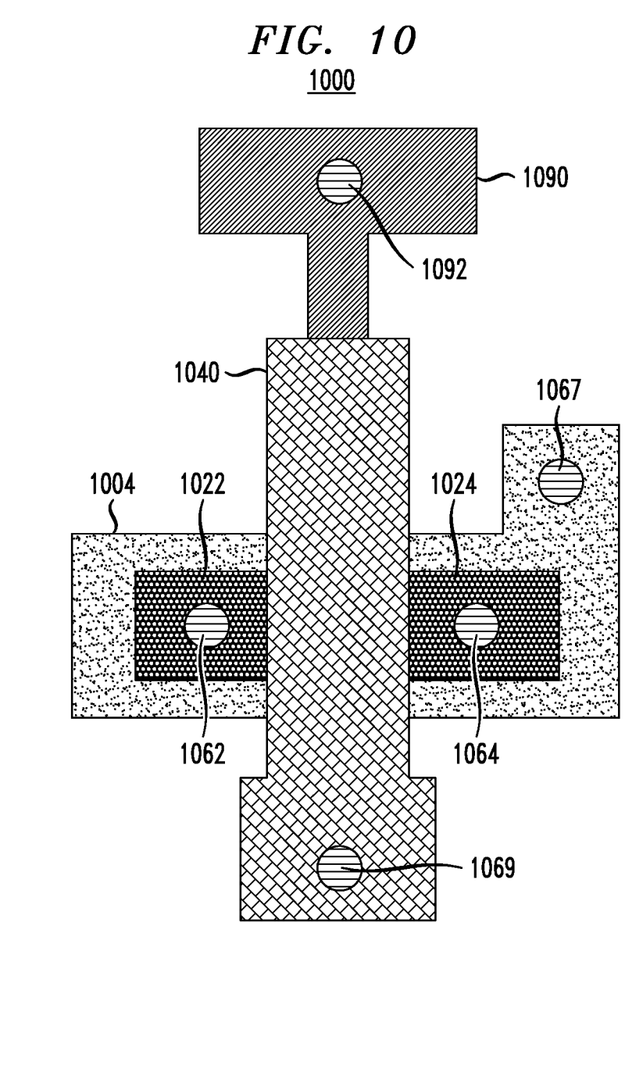
FIG. 10 is a top layout view illustrating a polysilicon TFT on a back gate with a body contact connected to a channel region and including source and drain regions implanted with lithium, according to an exemplary embodiment of the present invention.

FIGS. 9 and 10 are top layout views illustrating a polysilicon TFT on a back gate without a body contact connected to a channel region, and a polysilicon TFT on a back gate with a body contact connected to a channel region, respectively. The TFTs of FIGS. 9 and 10 include source and drain regions implanted with lithium, according to exemplary embodiments of the present invention. Referring to FIGS. 9 and 10, the devices 900 and 1000 each include a TFT similar to the TFTs 500 and 700 shown in FIGS. 5 and 7. Unless otherwise indicated, elements in FIGS. 9 and 10 with similar reference numbers to those in FIGS. 5 and 7 have the same or similar structure as those elements in FIGS. 5 and 7, and for the sake of brevity, duplicative descriptions of those elements are omitted. Layouts similar to those shown in FIGS. 9 and 10 may also be applied to devices with metal gate TFTs similar to the TFTs 600 and 800 shown in FIGS. 6 and 8.

Gates 940 and 1040 including the same or similar material and structure as the gates 540 and 740 are formed on a gate dielectric layer (not shown) over a channel layer (not shown). Source and drain regions are formed adjacent to the channel layer. Lithium is introduced, for example, by a known implantation process, in the source and drain regions, respectively, as shown by elements 922/1022 and 924/1024.

The TFT devices in FIGS. 9 and 10 are formed on and/or electronically connected to back gates comprising a thin dielectric layer 904/1004 formed thereon. The back gates and thin dielectric layers 904/1004 include the same or similar material and structure as the back gate and thin dielectric layers 502, 702 and 504, 704.

Contacts to the sources, drains and gates 940/1040 are made using, for example, vias 962/1062, 964/1064 and 969/1069 that connect to metal contacts in an upper metal interconnect layer MxPlus of the BEOL. The vias 962/1062 and 964/1064 contact the layers 922/1022 and 924/1024 on the source and drain regions. A contact to the back gate is made using, for example, a via 967/1067 formed through the dielectric layer 904/1004 that connects to a metal contact in the upper metal interconnect layer MxPlus of the BEOL. The back gate can be formed on or electrically connected with a via to a metal contact of a lower metal interconnect layer Mx of the BEOL.

Unlike the device 900, the device 1000 includes a body contact 1090 connected to a channel region (not shown). An electrical connection to the body contact 1090 is made using, for example, a via 1092 that connects to a metal contact in the upper metal interconnect layer MxPlus of the BEOL.

Figure 11:
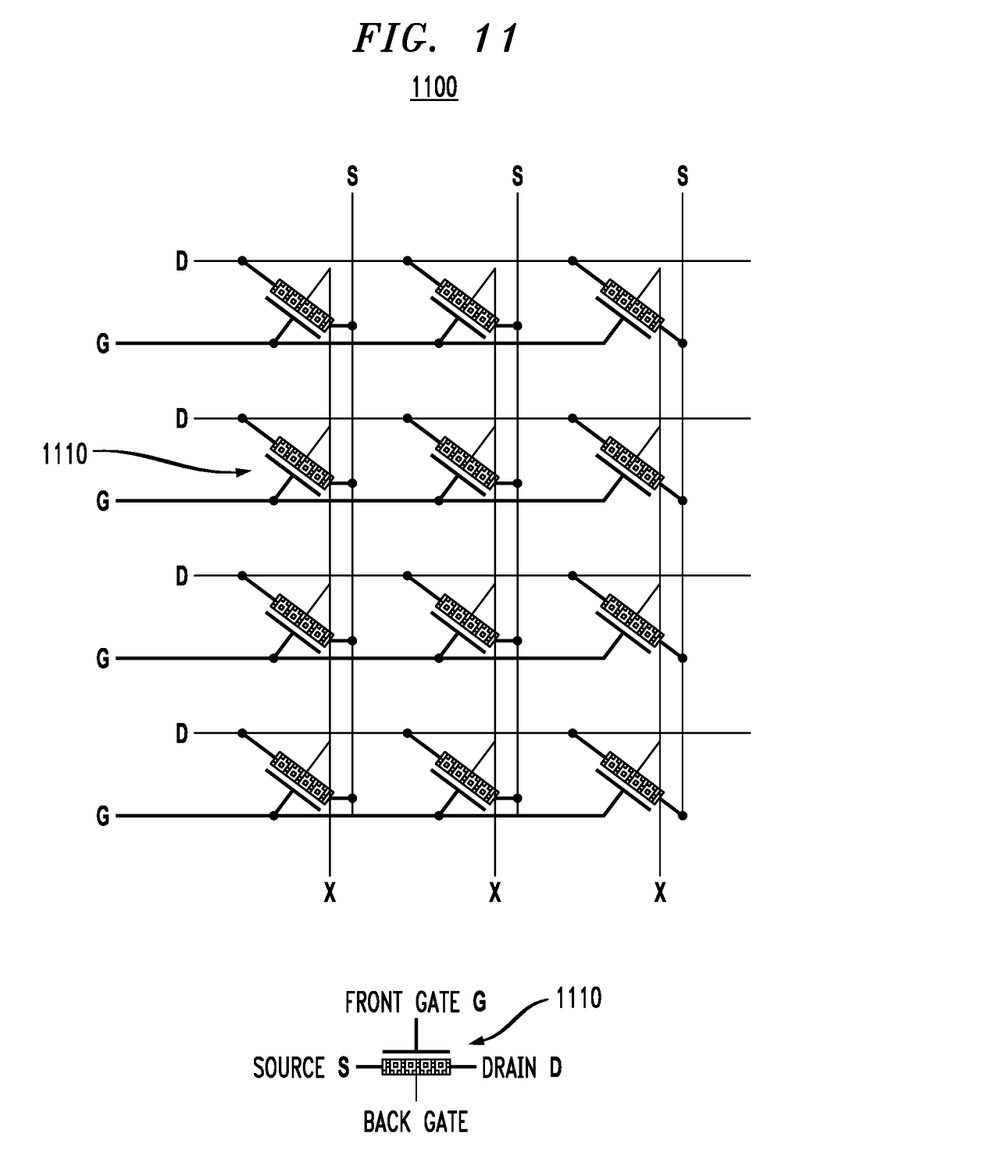
FIG. 11 illustrates an array of lithium-doped field-effect transistor (FET) devices, according to an exemplary embodiment of the present invention.

FIG. 11 illustrates an array of lithium-doped field-effect transistor (FET) devices, according to an exemplary embodiment of the present invention. Referring to FIG. 11, the array 1100 of lithium-doped FETs 1110 includes a plurality front gate voltage lines G, a plurality of source voltage lines S, a plurality of drain voltage lines D and a plurality of optional back gate voltage lines X. The front gate lines and back gate lines (if present) are connected to upper metallization level MxPlus or higher. If there are no back gates, the back gate voltage lines can be omitted.

Forward and backward pass operations in connection with RPU functionality use the channel resistance from source to drain in the transistors 1110. Weight update operations can be performed using stochastic bit streams relying on a variety of different possible combinations, such as, for example, gate-substrate, gate-source, or source-drain. Using gate-substrate for write operations decouples write from read (source-drain).

Each of the FETs 1110 in the array 1100 can have one or a combination of the structures described in connection with FIGS. 1-3 and 5-10 described herein.

As described herein, embodiments of the present invention provide for use of lithium drift in a TFT structure to achieve an RPU element in the BEOL without having any impact on the FEOL. The embodiments are easily and inexpensively integrated into POR CMOS processes, and provide for symmetric response (e.g., drift can be reversed by applying opposite polarity). In accordance with an embodiment of the present invention, RPUs are enabled with multi-state FETs that change their states based on lithium motion. The resulting change in threshold voltage leads to a change in resistance of the FET itself.

The length of metal lines in connection with TFT structures being used as RPUs is limited by the frequency of operation. For example, an estimated length is approximately 1.6 mm for a 1 GHz design. A BEOL array greatly reduces this length, as the active circuitry can be placed below the array and the metal layers above and below a magnetic tunnel junction (MTJ) can be used for wiring. Chip area is also reduced as active circuit elements can be placed in the FEOL below the array, and a transistor crosspoint cell can be produced with a smaller overall chip area.

Embodiments of the present invention provide for a large number of possible states since lithium can be incrementally drifted to give small threshold voltage shifts. According to one or more embodiments of the present invention, RPU element resistance range can be modulated through gate bias, read and write operations can be decoupled through substrate or back gate contact, and minimal read disturbance can be achieved by low-voltage symmetric AC source-drain bias.

Embodiments of the present invention also provide non-volatility (assuming no thermal diffusion of lithium at operating conditions), and increased reliability due to the ability to confine lithium silicon, germanium or other channel material by using barrier layers.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
    a field-effect transistor, wherein a portion of the field-effect transistor comprises lithium therein;
    a first back-end-of-line metallization level; and
    a second back-end-of-line metallization level disposed above the first back-end-of-line metallization level;
    wherein the field-effect transistor is integrated between the first and second back-end-of-line metallization levels;
    wherein the field-effect transistor comprises a channel layer, a source region, a drain region, a gate dielectric layer disposed on top surfaces of the channel layer, the source region and the drain region, and a gate disposed on a top surface of the gate dielectric layer;
    wherein the source region and the drain region comprise the lithium therein;

wherein the lithium in the source region is at a higher concentration at an upper portion than at a lower portion of the source region;

wherein the lithium in the drain region is at a higher concentration at an upper portion than at a lower portion of the drain region; and wherein the source region and the drain region are electrically connected to one or more contacts in the second back-end-of-line metallization level by respective vias located between the first and second back-end-of-line metallization levels and extending through the gate dielectric layer.

2. The semiconductor device according to claim 1, wherein the channel layer further comprises one of amorphous silicon, polycrystalline silicon and poly-germanium.

3. The semiconductor device according to claim 1, further comprising:
a back gate;
wherein the field-effect transistor is disposed on the back gate.

4. The semiconductor device according to claim 3, further comprising:
a dielectric layer disposed between the field-effect transistor and the back gate.

5. The semiconductor device according to claim 3, wherein the back gate is disposed on a contact in the first back-end-of-line metallization level.

6. The semiconductor device according to claim 3, wherein the back gate is electrically connected to a contact in the first back-end-of-line metallization level through a via.

7. A semiconductor device, comprising:
an array of resistive processing unit devices, wherein each resistive processing unit device in the array comprises:
a field-effect transistor integrated between a first back-end-of-line metallization level and a second back-end-of-line metallization level above the first back-end-of-line metallization level;
wherein a portion of each field-effect transistor comprises lithium therein;
wherein each field-effect transistor comprises a channel layer, a source region, a drain region, and a gate dielectric layer disposed on top surfaces of the channel layer, the source region and the drain region;
wherein a gate of each field-effect transistor is electrically connected to a contact of the second back-end-of-line metallization level and is disposed on a top surface of the gate dielectric layer;
wherein the source region and the drain region comprise the lithium therein; and
wherein the lithium in the source region is at a higher concentration at an upper portion than at a lower portion of the source region;
wherein the lithium in the drain region is at a higher concentration at an upper portion than at a lower portion of the drain region; and
wherein the source region and the drain region are electrically connected to one or more contacts in the second back-end-of-line metallization level by respective vias located between the first and second back-end-of-line metallization levels and extending through the gate dielectric layer.

8. The semiconductor device according to claim 7, wherein the channel layer further comprises one of amorphous silicon, polycrystalline silicon and poly-germanium.

9. The semiconductor device according to claim 1, wherein a depth of the lithium in each of the source and drain regions is less than a depth of the source and drain regions.

10. The semiconductor device according to claim 9, wherein the depth of the source and drain regions is about 10 nm to about 100 nm.

11. The semiconductor device according to claim 1, wherein each of the source and drain regions further comprises a dopant different from the lithium.

12. The semiconductor device according to claim 7, wherein a depth of the lithium in each of the source and drain regions is less than a depth of the source and drain regions.

13. The semiconductor device according to claim 12, wherein the depth of the source and drain regions is about 10 nm to about 100 nm.

14. The semiconductor device according to claim 7, wherein each of the source and drain regions further comprises a dopant different from the lithium.

* * * * *